United States Patent [19]

Clark

[11] 4,158,199

[45] Jun. 12, 1979

[54] DECODER FOR IDENTIFICATION OF BACTERIA

[76] Inventor: John W. Clark, R.R. 3, Box 326, Aurora, Ill. 60504

[21] Appl. No.: 831,432

[22] Filed: Sep. 8, 1977

[51] Int. Cl.$^2$ .............................................. G08B 5/36
[52] U.S. Cl. ............................. 340/711; 195/103.5 M; 340/762; 340/804
[58] Field of Search .................... 340/336, 337, 365 S; 128/2.05 R; 195/103.5 M

[56] References Cited

U.S. PATENT DOCUMENTS 4,024,530  5/1977  Hughes .......................... 340/336 X Primary Examiner—David L. Trafton
Attorney, Agent, or Firm—Sixbey, Friedman & Leedom

[57] ABSTRACT

A device for the automatic conversion of binary to octal information for the identification of bacteria including switching means controlled as a function of predetermined biochemical reactions and means to convert the binary information provided by control of the position of the switches to octal information used in conjunction with an appropriate guide for identification of bacteria.

5 Claims, 2 Drawing Figures

DECODER FOR IDENTIFICATION OF BACTERIA

The present invention relates to a decoding device and, more particularly, to a decoding device for the convenient identification of bacteria as a function of certain predetermined reactions.

Identification of specific bacteria can be a difficult process in view of the fact that a significant number of test variables must be analyzed and correctly evaluated for such a determination. Guides have been developed for this identification which guides rely upon the results of certain biochemical tests and identify the bacteria as a function of a derived mathematical indicia dependent upon the results determined from said tests. These guides, however, depend upon number manipulation which may result in significant error in determination of the specific indicia to be correlated to the guide.

The present invention was developed to avoid manipulation of the generally unfamiliar binary number system to provide convenient, quick, sure results in identification without number manipulation.

It should be noted that the results of predetermined biochemical tests which are employed in the identification of bacteria may mathematically be represented in binary number code. That is the binary "0" may be selected to represent a negative reaction in the test and the binary "1" may be employed to represent a positive reaction in the test. If only one biochemical test were necessary for the identification of bacteria then, of course, guides and codes would not be required for identification. This is not the case, however, and the identification process is relatively laborious, being the accumulated result of a significant number of tests.

There presently are multimedia test systems and guides available for identification of bacteria which systems and guides require the utilization and manipulation of binary number codes. The manipulation of these codes eventually defines a multiple digit octal number and this number then is utilized, in combination with a prepared guide, to identify bacteria. It will readily be appreciated that the process is cumbersome and error prone.

The device which I have developed, and disclose here, avoids manipulation of the character noted and provides a direct binary to octal decoder thereby automatically providing the binary to octal conversion and defining a system and device to avoid errors characteristic of manually-derived conversions.

The novel features which are believed to be characteristic of the invention are set forth with particularity in the appended claims. The invention itself, however, together with further objects and advantages thereof will best be understood by reference to the following description taken in connection with the accompanying drawings, in which:

Figure 1:
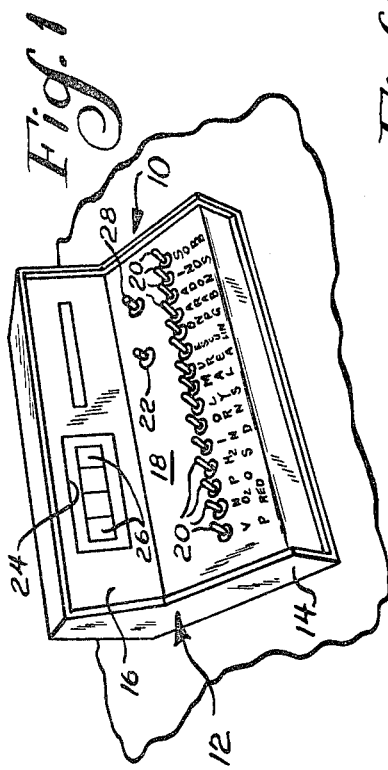
FIG. 1 is a perspective view of the device of the present invention.

Referring more specifically now to the drawings, the device is schematically illustrated at 10 in FIG. 1 and, as illustrated, is housed within a cabinet 12 having a base section 14 and upstanding display section 16.

The base section 14 defines a panel face 18 through which a series of switch elements 20 extend. The switch elements 20 define the binary selection function of the apparatus in carrying out the designed mode of determining a guide number for identification of bacteria as a function of the results of a series of predetermined biochemical tests.

An on-off switch 22 may be provided for the device 10 to disable it when not in use.

As noted, the device set forth herein is provided with a series of toggle switches each representing a selected biochemical reaction performed on the bacteria to be identified. The binary to octal decoder set forth may be employed with any selected set of biochemical tests, whether they are commercially prepared multimedia systems commonly known in the art, or whether they are conventional tube tests. An appropriate taxonomic key or guide may be prepared from standard reaction charts for any group of bacteria. Once the key is defined appropriate labels may be prepared for the battery of biochemical tests and affixed to the panel 14 of the device 10 adjacent the appropriate switch 20, as schematically represented in FIG. 1. To change from one battery of tests or systems to another would require only a change of switch indicia which may be readily and quickly accomplished.

The display section panel face 18 defines an opening 24 through which the numeric display elements 26 may be viewed. The numeric display elements 26 contain the derived octal information for display and which will be used with the taxonomic key to identify the selected bacteria.

To avoid high power drain in energization of the octal display elements 26 a display switch 28 may be employed to energize the display as desired. The switch 28 may be interposed between the display elements 26 and the power source (noted below) to control powering of the display elements so that display is realized only when necessary or desired by the user. It can readily be appreciated that in circuits of the type noted herein the largest power drain generally is in the display. For example, the present device may utilize so-called LED's for the display. In this instance the LED's will cause more power to be drained from the power source during any given unit of time than operation of the remaining circuit functions of the device. Accordingly, limited use of the display will result in a proportionate increase in useable time of the device without changing batteries, if the power source is in this form. If an a.c. supply is used, then, of course, this may not be a matter of concern.

Figure 2:
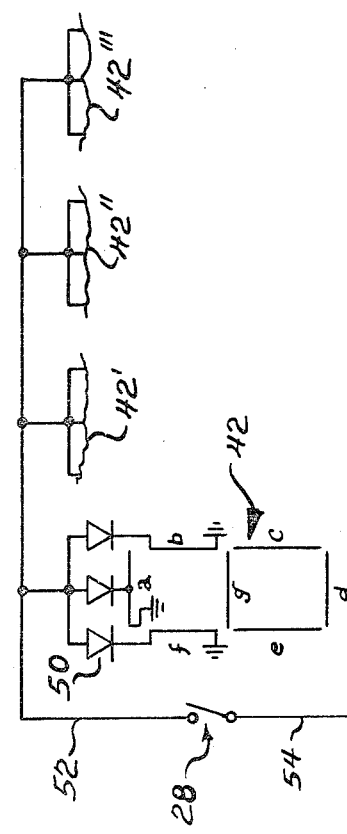
FIG. 2 is a schematic drawing of the circuit employed in the device.
Figure 2:
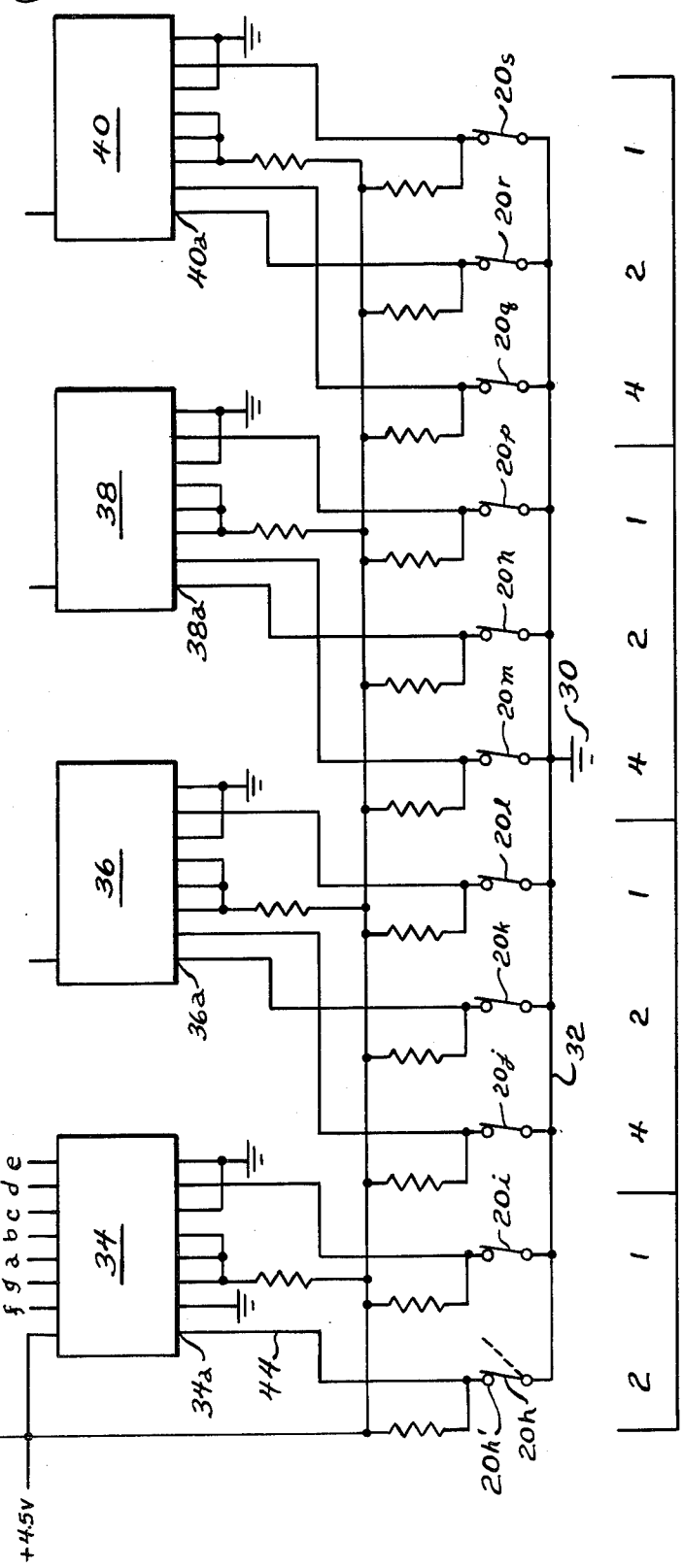

As shown in the schematic representation of the circuit of FIG. 2 of the drawings, the device consists, in part, of a series of single pole switch elements 20, indicated in FIG. 2 at 20h through 20s, respectively. One terminal of each of the single pole switches 20 is connected to reference voltage or ground 30 through the common bus 32. The other terminals of the switches 20, respectively, are connected to an appropriate terminal of a related type 7447 integrated circuit with the leads extending from said other terminals (20) to the BCD (Binary Coded Decimal) input terminals of the 7447 IC. The IC's 34, 36, 38 and 40, respectively, are intelligence-transforming elements interposed between the switches 20 (h-s) and the display elements, one of the display elements being schematically shown at 42 in FIG. 2.

As is well known the method of sending information by switching is called a "digital method." A change in voltage in the leads from a low voltage (e.g., "0") to a high voltage carries the information. In the present instance we have illustrated the device for use with a 4.5 volt power supply comprised of 3 "AA" batteries in series so that the low voltage state will be reference or "0" and the high voltage state will approach 4.5 volts.

If we use the low voltage state to represent 0 and the high voltage state to represent 1 we then can transmit information digitally by use of the binary number system.

The integrated circuits 34-40 have the ability to assimilate the digital information provided to it as a function of the positions of the switches 20h-s to make decisions and thereby to solve simple mathematical problems. The answers it can provide are made with great accuracy and, as far as the user is concerned, immediately. The switches 20 serve as a fundamental keyboard for the IC's defining a number for each element of information to be provided to the IC's. If we throw one switch we, in effect, tell the IC to transmit a "yes" signal to the number chosen. The IC senses the command and using this binary information will convert it, when all of the switch decisions are programmed into it, into a decimal number by automatic manipulation of the binary numbers within the IC. The IC becomes an information transducer by assimilating all of the binary information transmitted to it, adding or manipulating the information, and then converting it to a readout which is made available in the form of signals to the display elements 42 of the device.

The IC, of course, is provided with shift registers to temporarily store information fed to it until the information input process is completed. The registers, as is commonly known, temporarily store information before "shifting" it to subsequent processing. After all of the binary information is put into the IC's, the information then is manipulated to arrive at a composite indicia. The binary information then is converted to decimal form through a binary to decimal converter which, in turn, drives the display devices 42.

In the present system, light emitting diodes are employed in the display system, which diodes, in effect, are semiconductor light bulbs arranged in a matrix so that they can be selectively lighted to form digits. The elements of the matrix are powered at the right time by the output converter and the information appears on the displays 42.

The terminal 20h' is connected through the lead 44 to the input terminal 34a of the IC 34. It can readily be seen that the first input pin "a" of each of the IC's 34-40 are connected through interconnecting leads to the terminal 20h' and successive related terminals of the switches 20h-s of the device.

Switches 20h and 20i comprise the first information block for determination of a specific bacteria. These switches define the power input for the related IC (34). The position of the switches (open or closed) will determine the character of information to be directed to the IC 34. The circuit is defined such that when a given switch 20h-s is in a negative position (as a function of a negative biochemical reaction) it will ground the respective BCD pin of the 7447 IC thereby producing a "0" or low voltage state for that input terminal. Conversely, when the switch 20h-s is in a positive position (indicating a positive biochemical reaction) it causes an open circuit between ground and its respective BCD pin producing a high voltage state or binary "1". The 7447 IC, as noted above, manipulates and then converts the respective low and high voltage states into a series of electrical signals which activate the appropriate segments of the 7-segment LED display 42 of the device to provide for digital output information for the user. Accordingly, the decimal equivalent of the binary input can be read directly from the LED display 42.

As shown, the switches 20j, 20k and 20L form the information input block for the second IC (36) of the device and the switches are positioned in accordance with the results of related biochemical reactions and in accordance with the scale associated with the switches and placed on the face of the panel in registration with the switches. The IC 36 assimilates the binary input from the switches 20J, 20K and 20L, manipulates the binary information and converts it to decimal information as noted so that the data will be displayed in decimal form on the LED readout device 42' of the device 10.

Switches 20M, 20N and 20P form the binary information input means for the IC 38 of the device 10 and receive, manipulate and convert the information in the manner noted above. Similarly, switches 20Q, 20R and 20S for the information input means for the IC 40. Other switch means and related IC's and display elements may be added to the system as desired and function in a manner noted above in conjunction with discussion of the various elements of the system.

The output terminals a-g of the IC's 34-40 are connected, respectively, through appropriate lead elements to one side of the LED's a-g illustrated schematically at 42 in FIG. 2. The other side of the respective diodes a-g are connected through diodes 50 and lead 52 to one side of the switch 28. The other side of the switch 28 is connected to the 4.5 volt power supply through lead 54. It can readily be seen that the output a-g of the IC's independently control the sub-elements a-g of the related LED for control of the display information of the device 10.

The IC 34 is associated with the LED 42, IC 36 is associated with LED 42', IC 38 is associated with LED 42" and IC 40 is associated with LED 42'". The LED's 42', 42" and 42'" are not fully illustrated since they are duplicates of the IC 42 with associated output terminals of the IC's adapted to control the elements a-g of the LED's in the same manner as noted in the relationship of the IC 34 with the LED display 42.

The schematic illustration 10 of FIG. 1 of the drawings illustrates a device having more switches (20) than illustrated in the circuit drawings of FIG. 2. It should be noted that additional IC's may be added to the circuit element to provide whatever additional functions may be necessary or desired for selective determination of the data for identification of bacteria and addition of such circuit element would be in redundant form.

While a specific embodiment of the present invention is shown and described it will, of course, be understood that other modifications and alternative constructions may be used without departing from the true spirit and scope of this invention. I therefore intend by the appended claims to cover all such modifications and alternative constructions as fall within their true spirit and scope.

I claim:

1. A device involving manipulation of defined binary codes for determining data for the identification of bacteria, or the like, wherein manipulation of binary code data will provide a multiple digit octal number which, when used with a prepared guide, will give pre-determined identification of bacteria, the device comprising, in combination:

switch means to be manipulated between a first and second position to define a binary position;

integrated circuit elements associated with said switch means, respectively, and adapted to convert the binary input information to appropriate octal code within the circuit element; and display means electrically connected to the output of the integrated circuit elements to display the manipulated octal information of the circuit elements to provide a code number display to the user, as desired.

2. In a device as claimed in claim 1, wherein selective actuation of said switch means transmits information digitally by use of the binary number system.

3. In a device as claimed in claim 2, wherein said integrated circuits between said switch means and said display means is such as to serve to assimilate digital information imparted thereto as a function of positions of said switch means, and to convert the information into a decimal number by automatic manipulation of the binary numbers within the integrated circuit and converting the information into displayed readout signals.

4. In a device as claimed in claim 3, said displayed readout signals comprising light emitting diodes serving in the display system to form a digital readout.

5. In a device as claimed in claim 4, a direct current source for energizing the octal information display means and switch means operable to selectively energize and deenergize the display means to decrease current drain from said source.

* * * * *